(12) United States Patent
Becht et al.

(10) Patent No.: US 8,469,606 B2
(45) Date of Patent: Jun. 25, 2013

(54) OPTOELECTRONIC INTERCONNECTION SYSTEM

(75) Inventors: Markus Becht, Marxzell-Pfaffenrot (DE); Markus Dittman, Karlsruhe (DE); Dieter Jurzitza, Karlsruhe (DE); Hans Peter Mauderer, Gaggenau (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 366 days.

(21) Appl. No.: 12/691,731

(22) Filed: Jan. 21, 2010

(65) Prior Publication Data

US 2010/0183267 A1  Jul. 22, 2010

(30) Foreign Application Priority Data

Jan. 21, 2009  (EP) .................................... 09000808

(51) Int. Cl.
*G02B 6/36* (2006.01)
(52) U.S. Cl.
USPC .................................. 385/88; 29/428; 385/91
(58) Field of Classification Search
USPC ................. 385/88–92, 137; 29/428; 348/207, 348/335
See application file for complete search history.

(56) References Cited

U.S. PATENT DOCUMENTS

| | | | |
|---|---|---|---|
| 5,872,880 A * | 2/1999 | Maynard .......................... | 385/88 |
| 5,903,440 A * | 5/1999 | Blazier et al. .................. | 361/749 |
| 6,299,337 B1 | 10/2001 | Bachl et al. .................... | 362/545 |
| 6,454,470 B1 | 9/2002 | Dwarkin et al. ............... | 385/93 |
| 6,745,463 B1 * | 6/2004 | Chou ............................... | 29/852 |
| 6,912,332 B2 | 6/2005 | Han et al. ........................ | 385/14 |
| 6,922,344 B2 * | 7/2005 | Meyer-Guldner et al. ... | 361/772 |
| 7,190,854 B1 * | 3/2007 | Novotny et al. ................ | 385/18 |
| 7,290,944 B2 * | 11/2007 | Ishigami et al. ................ | 385/92 |
| 7,948,760 B2 * | 5/2011 | Kawauchi et al. ............. | 361/749 |
| 8,018,526 B2 * | 9/2011 | Minamio et al. ............... | 348/373 |
| 2001/0055073 A1 * | 12/2001 | Shinomiya ...................... | 348/374 |
| 2005/0035443 A1 * | 2/2005 | Meyer-Guldner et al. ... | 257/696 |
| 2005/0276547 A1 | 12/2005 | Wang et al. ..................... | 385/92 |
| 2006/0225914 A1 * | 10/2006 | Tan .................................. | 174/254 |
| 2006/0257081 A1 | 11/2006 | Ishigami et al. ................ | 385/92 |
| 2008/0179079 A1 * | 7/2008 | Ishii et al. ....................... | 174/254 |

FOREIGN PATENT DOCUMENTS

| | | |
|---|---|---|
| DE | 102 25 543 A1 | 12/2003 |
| EP | 0 709 699 A2 | 5/1996 |
| EP | 1 033 525 A2 | 9/2000 |
| WO | WO 2006/066636 A1 | 6/2006 |
| WO | WO 2008/046188 A1 | 4/2008 |

OTHER PUBLICATIONS

European Search Report dated Oct. 15, 2009, issued in European Patent Application No. 09 00 0808, 19 pages.
European Office Action dated Nov. 30, 2012, issued in European Patent Application No. 09 000 808.7, 6 pages, European Patent Office, Munich, Germany.

* cited by examiner

*Primary Examiner* — Ellen Kim
(74) *Attorney, Agent, or Firm* — Brinks Hofer Gilson & Lione

(57) ABSTRACT

An optoelectronic interconnection system is for use in optical communications. The optoelectronic interconnection system may include a substrate having a main portion and a foldable portion formed on a substrate of a board for positioning an optically active device connected to the foldable portion. The foldable portion is adapted to be folded with respect to the main portion into a desired optical coupling orientation for which an optical operative axis (OA) of the optically active device arranged therein is substantially aligned with an optical transmission axis (TT') that is other than perpendicular to the main portion. A holding fixture holds the foldable portion in the desired optical coupling orientation.

24 Claims, 6 Drawing Sheets

OPTOELECTRONIC INTERCONNECTION SYSTEM

PRIORITY CLAIM

This application claims priority under 35 U.S.C §119 to the European patent application number 09000808.7, filed Jan. 21, 2009, entitled "Printed Circuit Board Fiber Optical Transceiver In Surface Mount Technology (SMT)."

BACKGROUND OF THE INVENTION

1. Technical Field

This invention relates generally to optical interconnection devices for optical communication systems and, more particularly, to optical interconnection devices for coupling an optoelectronic device to an optical fiber that is led in parallel to the circuit board onto which the optoelectronic device is arranged.

2. Related Art

Telecommunication technology increasingly has a need to incorporate optical fiber components in designs for signal transmission. Optical fiber components may provide an alternative to conventional electrical wires. However, surface-mount optoelectronic devices may include an operative axis that is perpendicular to their mounting surface, which require significant volume space.

SUMMARY

An optoelectronic interconnection system and method of making an optical interconnection may allow communication devices to optically couple an optically active device. As an example, the optically active device may be mounted on a substrate of a board with an optical transmission line aligned in a first direction with respect to the substrate board, and independent of the direction of an optical operative axis of the device. As another example, a circuit board with multiple function circuit blocks and having a small section for arranging an optically active device (OAD) may be brought into an upright position with respect to the main circuit board.

In still another example, use of the optoelectronic interconnection system in optical communications may include a substrate of a board having a main portion and a foldable portion formed on the substrate for arranging an optically active device. The foldable portion may be configured or adapted to be folded with respect to the main portion into a desired optical coupling orientation. An optical operative axis of the optically active device may be arranged to be substantially aligned with an optical transmission axis that is not perpendicular to the main portion.

As another example, an OAD device may be mounted in a reserved section of a substrate of a board that may be inclined or bowed with respect to the main portion. In order to permit alignment of an optical operative axis of the OAD in any direction. In this way, use of cumbersome light bending means in association with the OAD for deviating the direction of transmission of optical signals may be minimized or eliminated entirely. Furthermore, the location of the foldable portion may be chosen close to an edge of the board in order to facilitate the optical interface with an external harness.

In a further example, the foldable portion may include a substantially flat central surface for arranging the optically active device therein, and an end part that is mechanically connected to the main portion by a bending edge. The bending edge is adapted to allow the substantially flat central surface to be bowed with respect to the main portion by a desired bend angle.

Configuring the optical operative axis of the optically active device to be substantially perpendicular to the mounting surface for the optically active device may provide an optical coupling orientation corresponding to an orientation of the foldable portion for which the substantially flat surface becomes substantially perpendicular to the optical transmission axis. The direction of the optical transmission axis with respect to the main portion may be any angle.

In particular, when the optical transmission axis is substantially parallel to the main portion, the desired optical coupling position may correspond to having the foldable portion inclined with respect to the main portion by an angle such that the optical operative axis of the optically active device may become substantially parallel to the main portion.

Accordingly, an optically active device may be interfaced with an optical fiber cable running in parallel with the main board, irrespective of the direction of its optical operative axis. In order to provide flexibility in the location of the optically active device in the substrate, the main portion may be provided with an opening and the foldable portion may be mechanically connected over the opening by the bending edge. This opening may be dimensioned to allow the foldable portion to be freely folded with respect to the opening.

As a further example, the foldable portion may be shaped as a reed that is formed on the substrate by forming or milling a slot along edges of the reed that are to be freed from the substrate. As used herein, a reed may include a small flexible part of a substrate or board that is coupled or attached to a portion of the substrate or board, where an optically active device is coupled or attached or arranged on the reed to receive signals from an optical fiber. The flexible portion may be dimensioned to reed. Reed and flexible portion are used herein as examples and without limitation. The bending edge is a bending slot formed at the end part of the foldable portion by partially milling the thickness of the substrate down to a desired bending thickness.

The desired bending thickness may be chosen to provide increased flexibility of the substrate in the bending region. Since the foldable portion and bending edge are formed from the same substrate board, the number of assembly parts of the optical interconnection system may be minimized.

In order to provide electrical connections of the optically active device to external circuitry, the foldable portion may be adapted to electrically interface the optically active device. The foldable portion and the substrate may include embedded conductive pathways adapted to electrically interface the foldable portion with the main portion. This may reduce or eliminate the need to perform electrical connections by wire-bonding between the main and the foldable portions.

As another example, the substrate may be a printed circuit board that includes a plurality of contacts for electrically interfacing with a host circuit board of a host system. A portion of these contacts may be configured or adapted to be electrically coupled to the optically active device. Therefore, the optoelectronic interconnection system may also be used as an independent optical connector for interfacing a further circuit board.

In order to maintain the foldable portion in the desired optical coupling orientation with respect to the main portion, the optoelectronic interconnection system may be provided with a holding fixture adapted to attach or couple to the foldable portion and to hold the foldable portion in the desired optical coupling orientation with respect to the main portion.

In particular, the holding fixture may include a first fixation element and a second fixation element, the first fixation element being adapted to couple with a first receiving element provided in the main portion, and the second fixation element being adapted to couple with a second receiving element provided in the foldable portion. In one example, the coupling between the first and second fixation elements and the respective first and second receiving elements may be a snap fit, a friction fit, or any other form of coupling mechanism.

Alternatively or in addition, the holding fixture may include a first opening and a second opening that is connected to the first opening by an internal guiding path, the first and the second openings may be disposed in the holding fixture so that when the holding fixture is attached or coupled to the foldable portion, the first opening is adapted to receive an end part of an optical transmission line, the end part being substantially aligned with the optical transmission axis, and the second opening is adapted to face the foldable portion and to enclose the optically active device arranged therein. In one example, the first opening may be provided as a ferrule receiving bore adapted to interconnect directly to the end part of the optical transmission line, and the end part of the optical transmission line may have a ferrule with an optical fiber held therein.

The holding fixture may also include an optical focusing device disposed between the first opening and the second opening for focusing an optical signal transmitted in the internal guiding path onto one of an optically active region of the optically active device and the end part of the optical transmission line. In addition, the internal guiding path may include an optical guide adapted to transmit an optical signal between the optically active device and the end part of the optical transmission line.

As a further alternative example, the optically active device may be an optical transceiver module that includes an electro-optical converter and an optoelectrical converter. By providing a complete and functional optical transceiver-module, all electronics, optoelectronics, and shielding may be included, such that little or no additional circuitry related to the optoelectrical functions and/or respective wire bonding are needed.

In this case, in order to provide the optical coupling to the optical transceiver module, the holding fixture may be adapted to receive an optical transmission line that includes, in one example, an incoming transmission line for transmitting an incoming optical signal to the optoelectrical converter component and an outgoing transmission line for transmitting an outgoing optical signal emitted by the electro-optical converter component. The foldable portion and the optically active device may be configured or adapted to be electrically interfaced by surface mount technology.

The optical interconnection system may include the optically active device arranged onto and electrically interfaced to the foldable portion. Therefore, the optoelectrical interconnection system may be provided either in a pre-assembled state or without the optically active device so that a user may choose the optically active device to be mounted. Alternatively, the optoelectrical interconnection system may be already provided as a complete optically interfacing module. In addition, the main portion includes a plurality of electronic circuits and may be applied to main circuit boards of any device. As an example, the main portion may be part of a motherboard that requires an optical interface.

As another example, the holding fixture may be attachable to and removable from the foldable portion and the main portion. In this case, by providing a holding fixture that is rigidly attachable to, but reversibly detachable from, the substrate and the reed, the holding fixture may be easily removed from the assembled optoelectrical interconnection system and the foldable portion unfolded if necessary for maintenance or substitution of components arranged on the substrate.

As another example, an assembly operation for producing an optoelectrical interconnection system for use in optical communications may include a providing a substrate that includes a main portion and a foldable portion formed on the substrate. The foldable portion of the substrate or board may be a substantially flat central surface for arranging an optically active device therein and have an end part that is mechanically connected over the opening of the substrate by a bending edge. The assembly operation may arrange the optically active device on the foldable portion. The assembly operation may also fold the foldable portion of the substrate or board to a desired optical coupling orientation for which an optical operative axis of the optically active device is substantially aligned with an optical transmission axis that is not perpendicular to the main portion.

The providing the substrate may further include forming the foldable portion with the shape of a reed by milling a slot across the thickness of the substrate and along edges of the reed that are to be freed from the substrate. The bending edge may be formed by partially milling a bending slot with a specified depth across the thickness of the substrate and along the edge of the reed to be bent.

In still another example, the optoelectronic interconnection system may include a holding fixture for holding the foldable portion in the desired optical coupling orientation, and the holding fixture may be shaped so as to mechanically couple with at least one of the freed edges of the foldable portion and to an attaching edge of the main portion that is oppositely disposed from the bending edge.

The solution described herein may be applied to all applications involving transmission of optical signals and optical interfacing with host devices. For example, an optical-ring based network may be modified to include modules with an optical transmission axis parallel to the substrate to provide a maximum flexibility by using one type of transceiver that is suitable for all applications and a minimum of component parts. Another advantage of the examples described herein is that the mounting of electronic components in the foldable and main portions, the bending process and the assembly with the holding fixture may be made as integral steps of a continuous manufacturing line.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PREFERRED EMBODIMENTS

Figure 1:
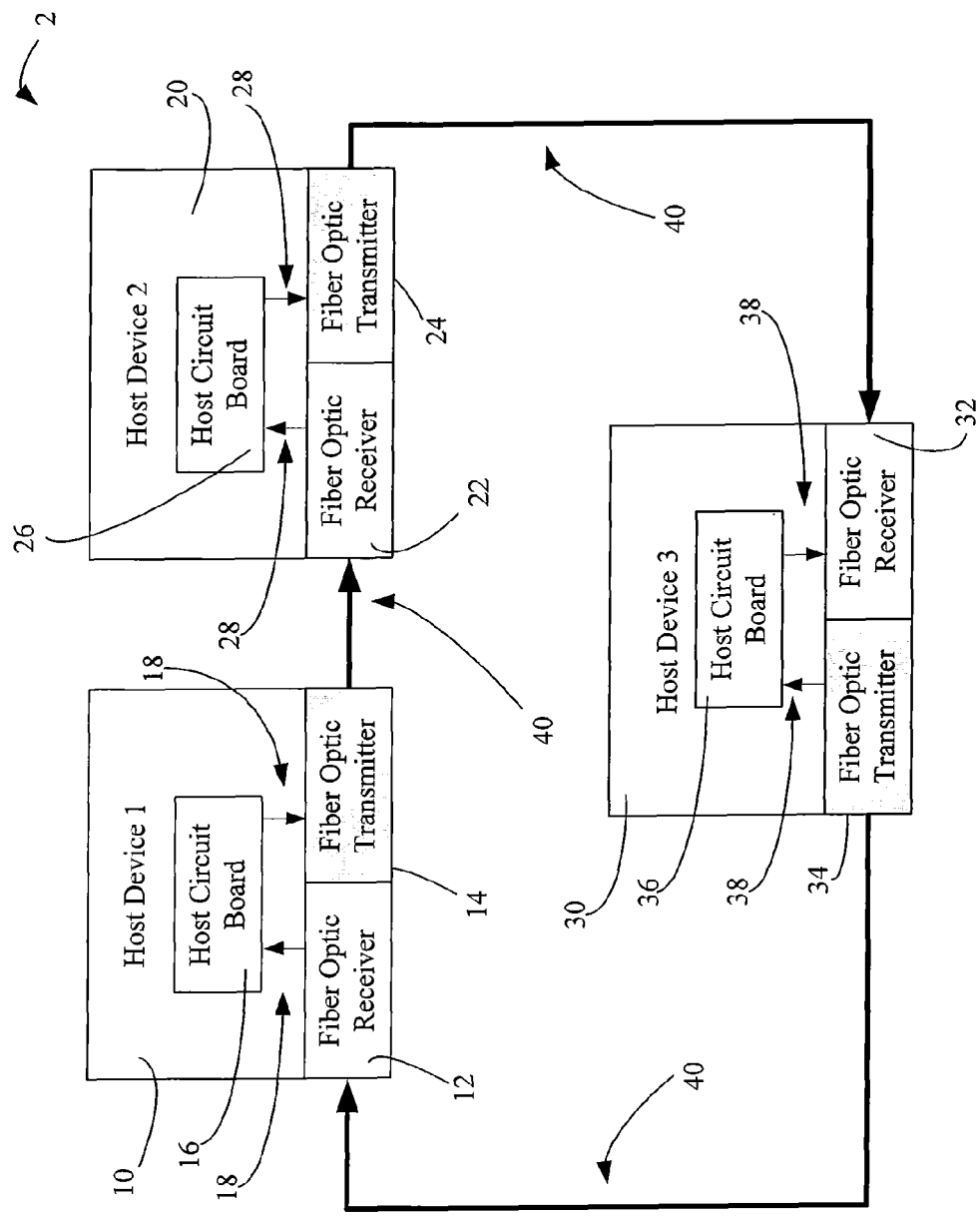
FIG. 1 depicts an optical network including host devices, where each of the host devices includes an optoelectronic interconnection system.

In FIG. 1, an example optical network 2 interconnects host device 1, host device 2, and host device 3, also referred to as host devices 10, 20, and 30 respectively, into a complex infotainment system. Having communication over an external harness, such as an optical fiber ring 40. This provides a high speed multimedia network for many specific applications such as in vehicles. Plug and play functionality of consumer electronic devices for digital entertainment and personal mobile devices may be safely and easily integrated into the network or other applications. As a non-limiting example, the host devices 10, 20, and 30 may include set top boxes, televisions, automotive electronics, entertainment electronics, military electronics, audio equipment, computers, servers, hard drive devices, read and/or write memory devices, handheld devices, communication equipment, and other devices that interconnect with networks, servers, computers, consumer electronics, and automobile electronics.

In FIG. 1, the optical fiber ring 40 includes a host device 10, a host device 20, and a host device 30. Optical signals may travel from one host device in the optical fiber ring 40 to the next via a polymer optical fiber (POF). At each of the host devices 10, 20, and 30, the incoming optical signals may be received by an optoelectrical converter, also referred to as Fiber-Optic Receiver (FOR), and transformed into electrical signals to be processed by the host devices 10, 20, and 30. The processed electrical signals may be fed to an electro-optical converter, also referred to as Fiber-Optic Transmitter (FOX). The electro-optical converter may convert the processed electrical signals into outgoing optical signals that are sent over the POF to the next host device 10, 20, 30, in the optical fiber ring 40.

The optical interface or plug-in connections 12, 22, and 32, of the host devices 10, 20, and 30 couple to the external harness and may use suitable optical interface connectors 14, 24, and 32 that do not compromise the size constraints of the host device.

A large number of applications including computers, diagnostic devices, entertainment systems, military electronics, aviation instrumentation, and telecommunication equipment frequently have two or more printed circuit boards stacked in a highly dense, parallel fashion in order to minimize their size. However, in the case of hand held devices, there is a desired to use optical devices that have reduced dimensions or assemblies that require less overall volume to be installed in a device.

To satisfy the continuing need for electronic equipment of reduced size and/or densely packed circuit boards, for the optoelectronic interconnection system provides optical interfacing connectors having reduced dimensions that may be integrated in the host devices and provide a parallel optical interconnection to the external harness.

In FIG. 1, pigtails 18, 28, and 38 may be used with or included in the optical connectors 14, 24, and 32. Pigtails 18, 28, and 38 may be available in a 90° configuration for allowing an optical connection between the circuit board 16, 26, 36 of the host device and an optical fiber cable aligned in parallel to the host circuit board. As shown with respect to host device 10, the pigtail 18 may include a Fiber-Optic Receiver 12 and/or Fiber-Optic Transmitter 14 housed inside a header. In one example, the electrical interface to the host circuit board 16 may be made via connecting pins protruding from a base of the header, which may also include other elements such as adapters and a sheet metal case for providing electromagnetic insulation from electromagnetic fields induced by neighboring circuits or from external fields. Ferrule holders at a lateral side of the header may provide the connection to an optical fiber arriving at a right angle with respect to the header connecting pins, therefore, parallel to the host circuit board 16.

The plug-in connection to an external harness may be provided by a connector (not shown). Depending on the type of pigtail, the header may be connected by a set of external optical fibers of a predetermined length to the connector. In this case, the pigtail being referred to as a "flexible pigtail," or the header may be integrated with the connector in a single unit. Alternatively the pigtail may be a "rigid pigtail," "micropigtail," or "Minipigtail".

However, pigtails may have several limitations. Apart from the significant size of the header, pigtails may not be suitable for automated mounting. Further, the header and/or the connector may be positioned in the host boards 10, 20, and 30 before soldering. As a result, the optical devices in the header may need to be resistant to the high temperatures used during the soldering process. Pigtail assemblies having pre-mounted pigtail fibers may require additional precautionary measures to avoid exposing the optical fiber to soldering heat. Further, in the example of a through-hole interface of the header to the host board, a relatively high degree of parasitic inducting capacitances and resistance may occur.

As an alternative packaging arrangement, a parallel optical interconnection between an optical fiber cable and the optoelectronic device may be used. As an example, the optoelectronic interconnection system may include an optical assembly of mirrors and lenses for deflecting the optical signal transmitted between an optical transmitting or receiving semiconductor die mounted on the module board and an optical fiber parallel to the board. As another example, the optoelectronic interconnection system may include a reflective surface formed at the end of a parallel optical wave guide. The reflective surface may change the direction of the light transmitted between the optical wave guide and a light source/photo detector accommodated in a silicon optical bench and aligned under the wave guide. A silicon optical bench may be used to accommodate the light source/photo detector.

The arrangement of light bending means in optical association with an optoelectronic device may direct a part of the light emitted by the optoelectronic device or optical fiber onto the optical fiber or optoelectronic device, respectively.

The arrangements of light bending means may include a considerable number of assembly parts. In addition, alignments between the optical assemblies and the respective optoelectronic devices may also be necessary for proper functioning. As a result, the number of parts and complexity of the alignments may limit the type of optoelectronic devices that may be used in association with a particular interconnection.

In an alternative example, optoelectronic devices and/or electro-optical devices having an optical cavity adapted to directly receive an optical fiber ferrule may be configured in a through-hole and/or a surface-mount packages that may be directly mounted on the host circuit board 16, 26, and 36 of the host devices 10, 20, and 30, respectively. The direction of the optical fiber connecting these devices depends on the orientation the operative optical axis of the optoelectronic device with respect to the surface onto which the optoelectronic device is mounted.

Through-hole package devices may include an operative optical axis that is perpendicular to the through-hole connecting pins. In other words, the operative optical axis may be in the direction of mounting and allow a direct coupling to an optical fiber running parallel to the mounting board. Through-hole devices may have to be mounted before soldering and may not be well adapted for automated mounting. Further, some packages may require numerous soldered and/or wire-bonded connections with the host circuit board resulting in a relatively high degree of parasitic inducting capacitances and resistance.

Optoelectronic devices in surface-mount packages may provide a means of connection that is less sensitive to numerous soldered and/or wire-bonded connections. The surface mounted packages may be a much smaller size that allows achieving high circuit densities. Parasitic inducting capacitances are also reduced. Surface-mount technology (SMT) may also allow a higher degree of automation. The increased automation may result in lower labor costs and better production and quality rates. Surface mount optoelectronics that do not require the optical fiber cable 40 to arrive at right angles to the circuit board or use light bending means in association with a parallel optical fiber cable may further reduce the volume of space required for the optical interface. For example, removal of light bending means and pigtails may permit integrate surface-mount optoelectronic devices in the optical interface of optical communication systems to be more densely packed in parallel arrangements on the host circuit boards 18, 28, and 36 and/or reduced dimensions of the optical devices.

Figure 2:
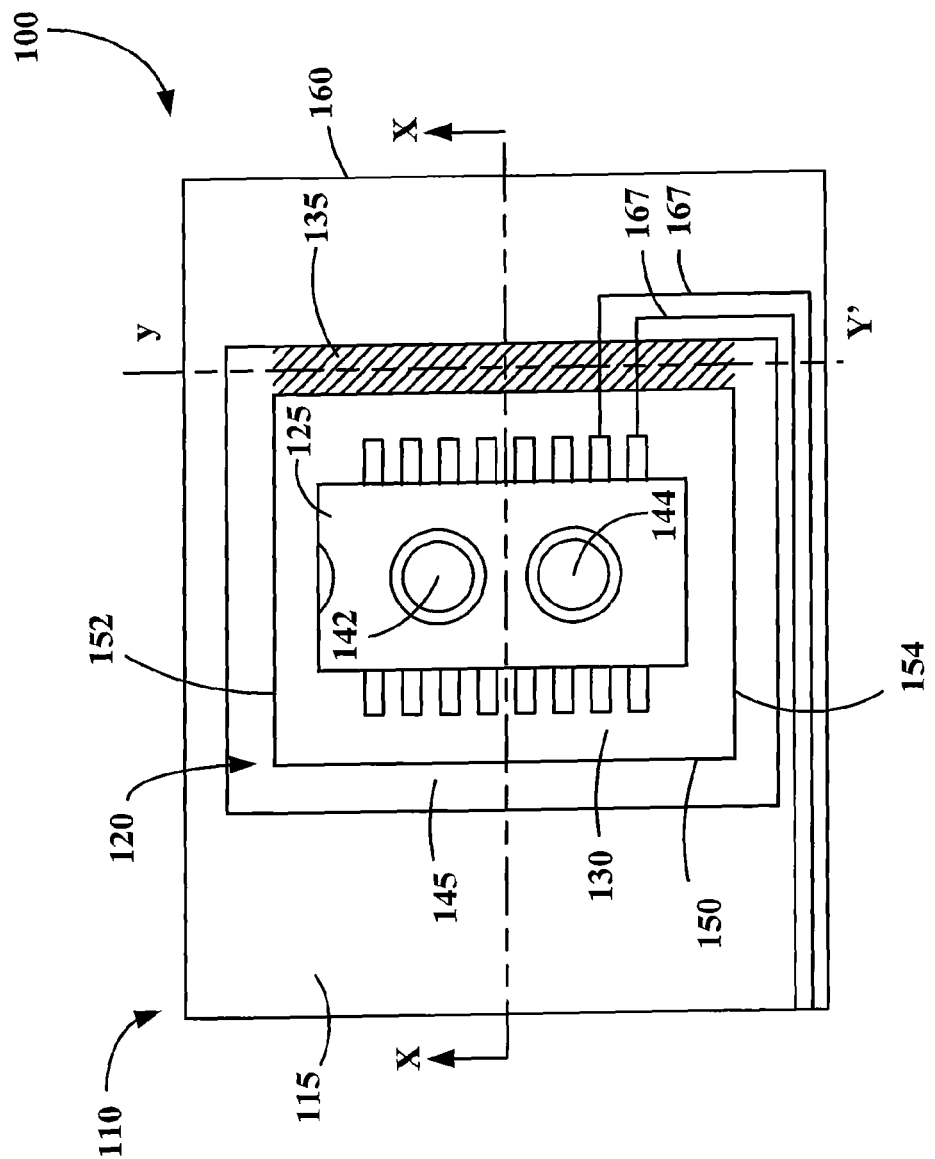
FIG. 2 depicts a top view showing a substrate of an example optoelectronic interconnection system, where the substrate includes a mounting area for mounting an optically active device.

In FIG. 2, an example of an optoelectrical interconnection system 100 (top view) and a substrate 110 having a mounting area for mounting an optically active device. As used herein, a substrate 110 may include a substrate board, circuit board, board, mother board, hybrid circuit, hybrid circuit board, or hybrid substrate, and/or other equivalents or combinations thereof.

The substrate 110 may include a main portion 115 and a foldable portion 120. The main portion 115 and foldable portion 120 may be formed on the substrate 110 for arranging therein an optically active device 125. The optically active device 125 may be optically coupled with an optical transmission line (not shown) having a predetermined, desired direction with respect to the main portion 115.

As used herein, the term "optical transmission line" refers to a single or multiple-strand light guides. The light guide may be an optical fiber or other light transmission system or device. The optical fiber may be a polymer optical fiber (POF) or may consist of glass or be coated with a material having an index of refraction lower than that of the fiber itself The term "optically active device" (OAD) as used herein refers to any optoelectronic transducer that is capable of converting electrical signals, voltage or current into electromagnetic radiation and/or converting electromagnetic radiation to electrical signals. Examples of such optically active devices include lasers, light emitting diodes (LED), photodiodes, optical transceivers, and other known semiconductor devices that are sensitive to light and light emitters. The term "optically active" does not imply that the device is currently in an active state of operation.

The substrate 110 may be any electrical circuit component or board that provides mechanical support and/or an electrical interface to electronic circuit elements mounted thereto or forming a part of electrical circuit elements. The substrate 110 may be designed for allowing electronic components to be mounted on an outer side and/or on opposite sides of the substrate 110. Alternatively, the substrate 110 may permit electronic components to be mounted on one side of the substrate 110.

As an example, the substrate 110 may be a printed circuit board (PCB), also commonly referred to as a printed wiring board or etched wiring board. The substrate may include one or more electrically insulating layers and one or more layers of conductive pathways made of an electrically conductive material such as copper or other materials suitable for transporting electric currents.

One or more conductive layers (not shown) may be inside the substrate 110. As an example multi-layer PCB, conductive layers may be embedded or sandwiched between two insulating layers. Alternatively or in addition, the substrate 110 may include electrically conductive traces on one or many surfaces of the substrate 110.

The insulating layer may be made of any material, such as epoxy-glass fabric composite. The insulating material may provide a substantially rigid surface. However, any suitable material having sufficiently low impedance matching, crosstalk, and skew may be used. Example materials may include glass-epoxy based, ceramic, and/or similar materials having insulative or isolative qualities that provide stable characteristics for low impedance matching, crosstalk and signal skew. The insulating layer may be selected based upon the flexibility of the material. As another example, the substrate may be a multilayer circuit board.

As another example, the substrate may include a first material in the non-folding regions of the substrate 110 and a second material in the folding regions of the substrate 110. The second material may be selectively less brittle than the first material to improve the flexibility of the bending edge 135.

The substrate 110 may further include contact regions (not shown) for electrically and mechanically connecting electronic components by through-hole technology and/or surface-mount technology, such as pin grid arrays, dual-in-line surface mount (SOIC) packages and ball grid arrays (BGA).

Figure 3:
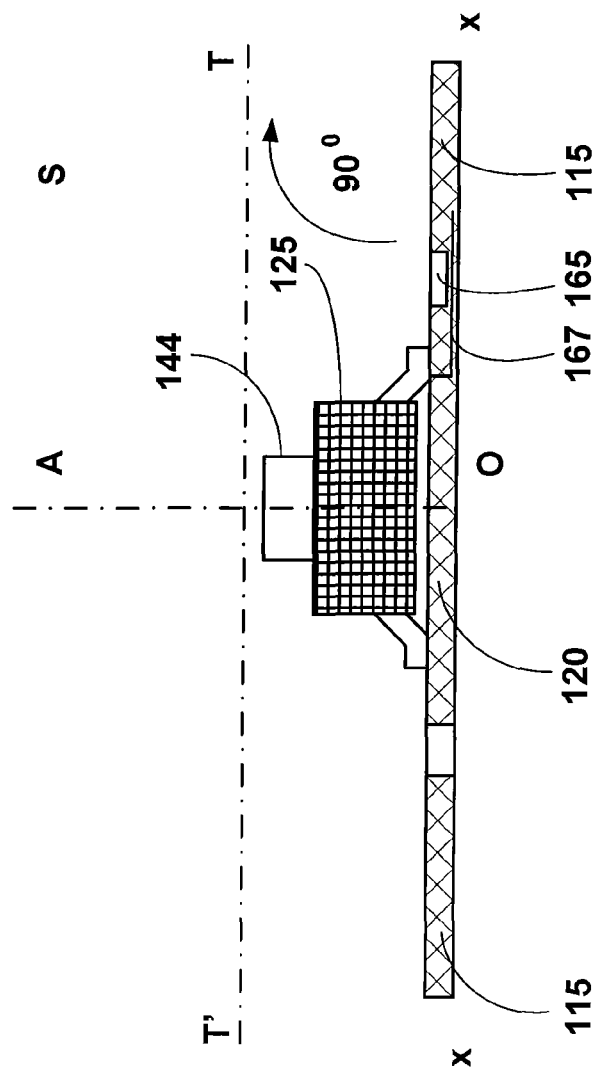
FIG. 3 depicts a cross-sectional view of the configuration illustrated in FIG. 2 along section x-x of FIG. 2.

In FIG. 3, the main portion 115 of the substrate 110 may be referred to as a main board 115. The main board 115 may include a substantially flat mounting surface formed with an area suitable for arranging one or a plurality of electronic circuit elements and electronic devices, such as integrated chips (not shown). One or more of these electronic circuits may include functions that are completely independent from the function of the OAD 125 mounted on the foldable portion 120. The independent electronic circuits may be electrically separated or electrically divorced from the foldable portion 120.

In particular, the substrate 110 may be used as a substrate 110 for a motherboard of a host device that requires an electro-optical interface and includes a plurality of circuit blocks, (not shown). The electrical circuit blocks may be in communication with the OAD 125 or independent from the OAD 125.

The main portion 115 may also include electrical connecting pins. As an example, an electrical connecting pin may protrude from the side of the optoelectrical interconnection system 100 to interface with a further substrate or PCB (not shown).

The foldable portion 120 is a portion of the substrate 110 apart from the main portion 115 that is reserved for mounting the OAD 125. The foldable portion 120 has a substantially flat central surface 130 with a mounting area suitable for arranging the OAD 125 therein and provided with contact regions for electrically and mechanically connecting the OAD 125 (not shown).

The OAD 125 may include a complete and functional surface-mount optical transceiver module including the functions of a fiber optic transmitter (FOX) and a fiber optic transceiver (FOT) and an electro-optical interface. The electro-optical interface may include a driver or pre-amplifier circuitry and shielding. In this case there may be no need to install additional electronic circuits directly related to the functioning of the OAD 125. For example, a driver may not be necessary in the main portion 115 and/or the foldable portion 120. Also, electrically connecting the optically active device to the main portion 115 by, for example, wire-bonding may be unnecessary. Therefore, a high degree of automation may be achieved. However, in alternative examples, the optoelectrical interconnection system 100 may also be used for OADs that are less than complete and functional, such as OADs having only the function of a FOX or a FOT.

The foldable portion 120 may be provided with contact pads, such as coupling points, for connecting the surface-mount OAD 125 by surface-mount technology. Alternatively, or in addition, the foldable portion 120 may be provided with other types of contact regions adapted to the type of OAD to be mounted, such as drilled vias or through-holes for mounting a through-hole OAD. The coupling points may be located on the first side and/or the second side of the foldable portion 120 to permit electrical components to be attached or coupled to the foldable portion 120. Likewise, additional through-holes may be located on the foldable portion 120 and main portion 115. Similarly, the main portion 115 may include contact points or through-holes for receiving electrical and mechanical components.

As illustrated in FIG. 2, the OAD 125 includes two optically active areas, a receiving optically active area 142 that is sensitive to incoming optical signals and an emitting optically active area 144 that emits outgoing optical signals. The term "optically active area" refers to a region of the OAD that emits electromagnetic radiation or that is sensitive to incident electromagnetic radiation. An optical operative axis generally refers to an axis that is perpendicular to and passing about the center of the optically active region. For example, the optical operative axis of a Light Emitting Diode (LED) corresponds to the average direction of the light emitted by the respective optically active region, which is substantially normal to the center of the optically active region.

As illustrated in FIG. 2, the optically active areas 142, 144 of the OAD 125 are substantially parallel to the mounting surface of the OAD 125. Therefore, the respective optical operative axis may be substantially perpendicular to the surface onto which the OAD 125 is mounted (not shown).

An end part of the foldable portion 120 remains mechanically connected to the main board 115 by a bending region, which will be referred to as a bending edge 135. The bending edge 135 may allow the foldable portion 120 to be folded or bowed as a whole with respect to the main board 115 by a predetermined bend angle. The bend angle is referred to as the angle made between the mounting surfaces of the foldable portion 120 and of the main portion 115, respectively.

The value of the desired bend angle may depend on the direction of the optical operative axis OA with respect to the surface the OAD 125 is mounted onto and on the direction of the optical transmission axis to which the OAD 125 will be optically coupled. The foldable portion 120 and the bending edge 135 may be formed from the substrate 110 to minimize the number of assembly parts of the optoelectrical interconnection system 100.

In FIG. 2, the foldable portion 120 is referred to as an area of the substrate 110 onto which the OAD 125 is intended to be mounted that is intended for mounting the OAD 125, and is freed from contact with the substrate 110 except on the bending edge 135, so as to allow the orientation of the OAD 125 with respect to the mounting surface of the main board 115 to be freely changed to a bend angle.

The foldable portion 120 may be formed close to a border of the substrate 110 so as to minimize the length of optical fiber passing over the substrate 110. However, the location of the foldable portion 120 in the substrate 110 may be located in other portions of the substrate 110 depending on other requirements such as circuit board design and the proximity of the OAD 125 to circuit blocks arranged in the main board 115 and with which the OAD 125 interacts. For example, the foldable portion 120 may be provided in an inner part of the main board 115 and/or be surrounded by electronic devices that populate the main board 115. Alternatively, the foldable portion 120 may be provided at a border of the substrate 110 such that one or more of its free edges coincide with the edges of the substrate 110.

The foldable portion 120 may be disposed initially flat substrate board 110 by milling a slot line 145 across the thickness of the substrate 110 and along the perimeter of the desired shape to create an edge of the foldable portion 120.

Machining may be performed before any electronic devices are assembled on the main portion 115 and/or on the foldable portion 120. Conventional machining tools including a carbide end-mill, a fly cutter, or similar tools may be used. A suitable machining technique may be chosen based on the type of substrate 10 and parts to be cut. In FIG. 2, the foldable portion 120 is a reed with a rectangular-like flat surface formed from the substrate 110 by milling or otherwise creating a number of slots that may cross each other. In one example, the slots may be straight slots. The slots may cross each other at substantially right angles.

Each slot 145 may be cut across the full thickness of the substrate 110 so as to free the respective edge of the reed 120 from mechanical contact with the substrate 110, thereby forming free edges of the foldable portion 120. This refers to an inner opening 118 (FIG. 4) in the main portion 115. A shape of the inner opening 118 may be substantially matched to the shape of the reed 120 and over which the reed 120 remains connected by the bending edge 135. In other examples, the shape of the inner opening 118 and the reed 120 may be different. The width of the milled slots 145 is such as to allow the reed 120 to be moved freely with respect to the substrate 110.

The size and shape of the foldable portion 120 may however vary based on design requirements for the specific circuit board, such as number and type of electronic components to be mounted therein, etc., and is not limited to the example depicted in FIG. 2. For instance, it may be envisaged to design a foldable portion 120 having one or more free edges that coincide with an edge of the substrate 110 itself. In case all free edges of the foldable portion 120 coincide with the borders of the substrate 110, there is no need of the slots 145. The substrate 110 may be cut to create the bending edge 135.

The bending edge 135 forms a rotation axis yy' upon which the foldable portion 120 may be rotated as a whole by the desired bend angle so as to be brought into a desired optical coupling orientation with respect to the main board 115. As an example, the bending edge 135 may be a region of the substrate 110 whose flexibility is locally increased (or its rigidity reduced) for allowing bending by the desired bend angle without breaking the substrate 110 at the flexible joint provided by the bending edge 135.

In FIG. 2, the bending edge 135 is substantially parallel to an upper free edge 150 of the foldable portion 120 and transversally intersects two lateral free edges 152, 154 of the foldable portion 120. The bending edge 135 and the upper free edge 150 of the foldable portion 120 are substantially parallel to a nearest border 160 of the substrate 110.

The bending edge 135 is formed at the end part of the foldable portion 120 by machining a bending slot or score line in the substrate 110 along the intended axis yy'. The substrate thickness along the bending edge 135 may be partially milled until reaching a predetermined bending thickness.

In FIG. 3, which is a cross-sectional view of the configuration illustrated in FIG. 2 along section x-x of FIG. 2, and in a state prior to bending, the bending slot 135 is referred to as a groove 165 having a rectangular cavity. The depth and width of the groove cavity 165 may be determined based on the desired bend angle. Additional considerations for determining the depth and width of the groove cavity may include recommendations and constraints given by the substrate suppliers and IPC (formally known as Interconnecting and Packaging Electronic Circuits) standards, total substrate thickness, bend radius, number of insulating and conductive layers for multi-layer circuit boards, the amount the substrate will bent, and/or the desired electrical properties of electrical connections passing between the foldable portion, the main portion, and bending edge of the substrate.

Typically recommended parameters for a FR-4 substrate are a remaining thickness of FR-4 in the bend region between about 0.20 mm and about 0.25 mm, independent of the total thickness of the substrate. In one example, for total thicknesses typically used in substrates and a bend angle of 90°, a 16.5 mm width groove may be used. The parameters of the bend region may also depend on whether the optoelectrical interconnection system 100 is intended for static applications, in which the substrate board 110 is installed folded on a device and it will not be unfolded again during the lifetime of the circuit board, or for dynamic applications and/or semidynamic applications, in which the substrate board 110 is folded/unfolded regularly or occasionally, respectively, for maintenance or repair of components.

The cavity of the groove 165 is not limited to a rectangular shape as shown in FIG. 3, but may be provided with other features that offer the advantage of increased torsional stiffness as well as the possibility of adhesive bonding of the final bent configuration. For example, the bottom of the groove cavity 165 may be structured with a saw tooth surface.

The bending may be performed with a suitable bending apparatus during construction and assembly of the optoelectrical interconnection system 100. In one example, bending may occur after the respective electronic devices are populated in the main portion 115 and in the foldable portion 120. Alternatively, the substrate 110 assembled with the electronic devices may be delivered in an unfolded state to be folded at a later stage.

The connection of the OAD 125 to external circuitry is realized via conductive pathways provided on the substrate 110 that interconnect electrically the foldable portion 120 with the main portion 115. These conductive pathways may be signal lines 167 located inside the substrate 110 in a manner so that they are undisturbed during the machining process. The signal lines 167 may be formed on a conductive layer located inside the substrate at a depth greater than the depth of groove cavity 165 so that they are not removed during the milling of the bending edge 135. The signal lines 167 may be designed to cross the bending region in a direction perpendicular to the bending edge 135 for reducing the effect of twisting forces on the signal lines 167 during bending. However, in specific cases, the electrical connection may be made by conductive pathways located at one of the outer surfaces of the substrate 110 or by other techniques such as wire bonding.

Generally, in order to optically couple the OAD 125 with an optical transmission axis TT' having a direction, the mounting plane of the foldable portion 120 may be bowed or folded up as a whole with respect to the plane of the main board 115 by a given bend angle such as to bring the optical operative axis OA of the OAD 125 into a direction that is substantially parallel to the desired optical transmission axis TT'. The optical transmission axis may or may not be formed to include light bending equipment.

The desired optical transmission axis TT' forms a direction along which the optical signals arrive at or leave the OAD 125. The desired optical coupling orientation may correspond to the relative orientation of the foldable portion 120 with respect to the main board 115 for which the optical operative axis OA of the OAD 125 mounted in the foldable portion 120 becomes parallel to the desired optical transmission axis TT'. The desired optical coupling orientation may therefore depend on the direction of the optical operative axis OA relative to the surface the OAD 125 is mounted onto, and on the orientation of the optical transmission axis TT' with respect to the main board 115.

In FIG. 3, the desired optical transmission axis TT' is substantially parallel to the main board 115. Prior to folding, the foldable portion 120 is substantially in the same plane of the main board 115 and the optical operative axis OA of the OAD 125 makes an angle of substantially 90° with the mounting planes of the foldable portion and main board 115.

When the foldable portion 120 is folded up from an initial in-plane orientation, in which the mounting plane of the foldable portion 120 substantially coincides with the mounting plane of the main board 115, to an out-of-plane orientation by a certain bend angle, the direction of the optical operative axis OA rotates on a plane transverse to the mounting plane of the main portion 115 by the same angle amount.

The plane of the foldable portion 120 may be folded up or bowed in a clockwise direction by a bend angle of 90° about the axis yy' formed by the bending edge 135 for bringing the optical operative axis OA into alignment with the desired optical transmission axis TT'. This means that the optical operative axis OA may rotate in a clockwise direction by 90° to acquire a direction that is substantially parallel to the mounting plane of the main portion 115.

The example optoelectrical interconnection system 100 may also be advantageously used for optically coupling the OAD 125 with an optical transmission axis TT' having any other direction with respect to the main board 115 by simply adjusting the desired optical coupling orientation, that is the desired bend angle, to the particular situation and using the same substrate board 110. For example, the optical operative axis OA may be substantially perpendicular to the mounting surface of the OAD 125 while the desired optical transmission axis TT' is not perpendicular to the main board 115. The folding portion 120 may be folded or bent to align the desired optical coupling orientation with an out-of-plane orientation where the mounting surface 130 of the foldable portion 120 becomes substantially perpendicular to the desired optical transmission axis TT'. On the other hand, in a case where the optical operative axis of the OAD 125 is not perpendicular to its mounting surface, the angle amount by which the foldable portion 120 is inclined is similarly adapted so as to bring the optical operative axis in alignment with the desired optical transmission axis TT'.

The folding of the foldable portion 120 may be performed as an integral step of a continuous assembly process and may be performed after mounting and electrically interfacing the OAD 125 in the foldable portion 120 and/or the other eventual electronic devices in the main board 115.

Figure 4:
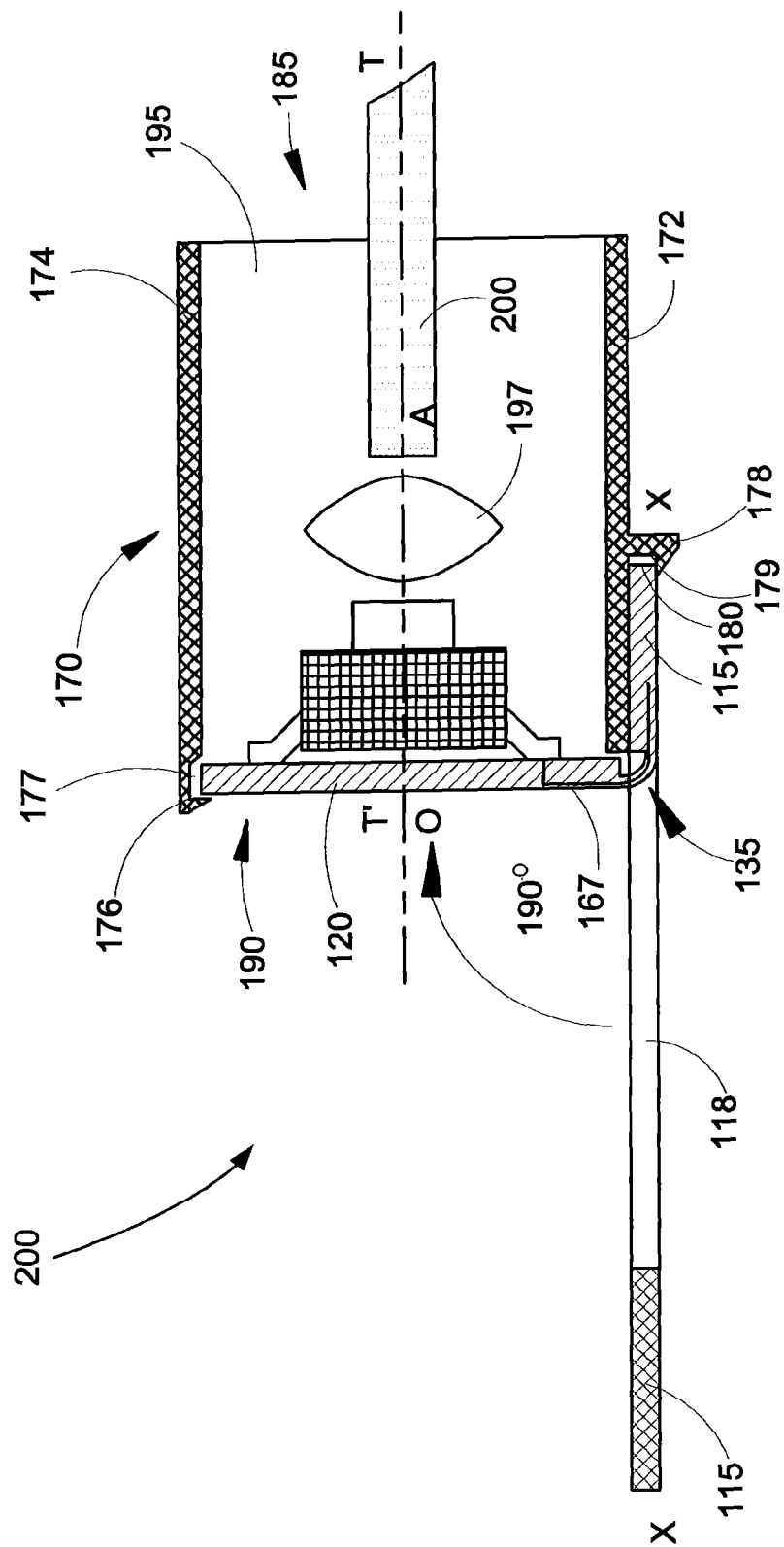
FIG. 4 depicts a cross-sectional view of a completely assembled optoelectrical interconnection system having a holding fixture.

In FIG. 4, a cross-sectional view of an example of a completely assembled optoelectrical interconnection system 100 that includes a holding fixture.

As illustrated in FIG. 4, the optoelectrical interconnection system 100 may include a holding fixture 170 that is attached or coupled to the foldable portion 120 and the main portion 115 after the OAD has been mounted for holding the foldable portion 120. The holding fixture 170 may be installed after bending or folding the foldable portion 120 relative to the main portion 115 into the desired optical coupling orientation with respect to the main portion 115. The holding fixture 170 permits the assembly to rigidly maintain the entire folded structure in the desired coupling configuration.

The holding fixture 170 may be a connector such as a cuboidal, hollowed connector having a longitudinal axis that is substantially parallel to the optical transmission axis TT' and transverse to the bending edge 135 and the foldable portion 120 when assembled to the optoelectrical interconnection system 100. The external dimensions of the holding fixture 170 may be based on the dimensions of the foldable portion 120, the location of the foldable portion 120 with respect to an attaching border 180 of the main portion 115 to which the holding fixture 170 will be coupled or attached, and on the desired bend angle. The holding fixture 170 may have a cross-section that substantially matches the mounting surface of the foldable portion 120.

A lower base 172 of the holding fixture 170 that faces the main portion 115 has a longitudinal length that may be at least equal to distance between the bending edge 135 and the attaching border 180 of the main portion 115. The transversal length may be substantially equal to the length of the bending edge 135. The dimensions of an upper part 174 of the holding fixture 170 may be substantially the same as of the lower base 172. However, the holding fixture 170 may be provided with different transverse and longitudinal lengths of the upper part 174 and the lower base 172, depending on the specific situation.

The holding fixture 170 has at least two fixation elements that may be adapted to couple with corresponding receiving elements provided in the foldable and main portions 115, 120, for rigidly fixing the holding fixture 170 to the substrate 110. The fixation elements and the corresponding receiving elements may be any mechanism or design that operates so that the holding fixture 170 may be attached or coupled to and/or removed from the foldable portion 120 and the main portion 115, respectively.

Referring to FIG. 4, a first fixation element 176 is provided on the upper part 174 of the holding fixture 170. In one example, the first fixation element includes a fixation groove 177 that is formed on the inner side of the upper part 174 on the side facing the foldable portion 120.

The fixation groove 177 runs parallel to the border of the upper part 174 of the holding fixture 170 such that when snapped to the foldable portion 120, it is substantially parallel to and approximately located above the bending edge 135 so as to hold the foldable portion 120 with the predetermined bend angle, such as 90°. However, the fixation groove 177 may be located at the left or right side above the bending edge 135 if the desired inclination for the foldable portion 120 should be less or greater than 90°.

In FIG. 4, a second fixation element 178 may be located on the outer side of the lower base 172 of the holding fixture 170 on the substrate 110. In one example, the second fixation element 179 may be provided as a protruding part having an arrow-shaped extremity with an indentation 179 and/or a lateral groove on the side facing the main portion 115 for snapping to an attaching edge 180 of the main portion 115. The attaching edge 180 is the border of the main portion 115 that is closer to the bending edge 135. The second fixation element 178 may extend along the whole or only a part of the transversal length of the holding fixture 170 and is located approximately at a distance from the end of the lower base 172 that is substantially equal to the distance between the bending edge 135 and the attaching border 180 of the main portion 115.

The fixation groove 177 and the indentation 179 may include rectangular shaped cavities of a width that substantially matches the total thickness of the substrate 110 so that they may be snapped to the edges of the reed 120 and of the main board 115 by applying a small pressure to the fixation elements 176, 178 and remain fastened once this pressure is removed. The holding fixture 170 may be later detached from the substrate if necessary by applying a counter force to the fixation elements 176, 178.

As an alternative example, to reduce potential EMI, the holder fixture 170 may be metallic and configured to provide EMI shielding. After fixation of the holder fixture 170, the holder fixture 170 may be coupled to the main portion 115 and flexible portion 120, such as by soldering. Alternatively, the main portion 115 and flexible portion 120 may include electrical contact pads configured to provide an electrical contact to the holder fixture 170. The holder fixture 170 may also include a surfaces area to establish an electrical connection between the metallic material of the holder fixture 170 and the electrical contact pads of the main portion 115 and flexible portion.

In order to assemble the holding fixture 170 to the optoelectrical interconnection system 100, the foldable portion 120 is first bowed up by a certain bend angle sufficient for coupling or snapping the first fixation element 176 to the upper free edge 150 of the foldable portion 120. In this case, the upper free edge 150 serves the purpose of a first receiving element that is provided in the foldable portion 120 for receiving and attaching the first fixation element 176. The foldable portion 120 is then brought to the desired optical coupling orientation and the second fixation element 178 is coupled to the attaching border 180 of the main portion 115. In this example, the attaching border 180 may serve the purpose of a second receiving element that is provided in the foldable portion 120 for receiving and attaching the second fixation element 178.

In order to increase the mechanical stability of the optoelectrical interconnection system 100 in the folded configuration, additional fixation elements similar to the first fixation element 176 may be provided in the lateral sides of the holding fixture 170 (not shown) for coupling to the lateral free edges 152, 154 of the reed.

The number and configuration of the fixation elements provided in the holding fixture 170 and/or of the receiving elements provided in the foldable portion 120 and main portion 115 are not limited to the illustrated example and other holding arrangements and/or coupling or snapping mechanisms suitable to keep the folded structure in the desired configuration may be adopted.

For instance, in order to compensate for pull- and shear forces exerted on the optical connector, the second fixation element 178 may be provided as two or more parallel protruding parts separated by a given distance and which may be brought close to each other by a slight compression so as to snap into receiving elements provided in the main portion 115, such as receiving holes. The extremity of each protruding part may be provided with an arrow-shape end and a lateral indentation disposed so as to fit to the opposing edge of the receiving hole, thereby rigidly attaching the holding fixture 170 to the main portion 115 once the slight compression is released.

The fixation elements may also be provided as small hooks distributed at certain points on the holding fixture 170. Alternatively, the fixation elements may be provided as pins that protrude longitudinally and transversally from the holding fixture 170 for snapping into matching holes that are drilled in the foldable and main portions for this purpose.

The above-described fixation elements may provide a reversible fixation mechanism that may be attached to and removable from the foldable portion 120 and the main board 115 if necessary. The reversible fixation mechanism or feature may allow unfolding of the foldable portion 120 from the desired optical coupling position for maintenance or substitution of electronic components.

As another example, a holding fixture 170 without detachable fixation elements as described above may be provided. For static applications in which the unfolding of the foldable portion 120 is not required, the holding fixture 170 may be permanently fixed to the foldable portion 120 and/or to the main board 115. For example, the holding fixture 170 may be provided as a molded plastic, hollow block whose sides facing the foldable portion 120 and the main portion 115 are permanently bonded to these portions. Alternatively, the holding fixture may include or be made of conductive material to reduce electromagnetic interference (EMI).

In order to allow the optical coupling of the OAD 125 with an optical transmission line, the holding fixture 170 may include one or more optical transmission line alignment receptacles. In one example, the optical transmission line alignment receptacle may be provided with two openings, a first opening 185 and a second opening 190, connected to each other by an internal guiding path 195. The first opening 185 and the second opening 190 may be disposed in the holding fixture 170. When the holding fixture 170 is attached or coupled to the foldable portion 120, the first opening 185 is adapted to receive an end part 200 of an optical transmission line, where the end part 200 may be substantially aligned with the desired optical transmission axis TT', and the second opening 190 is adapted to face the foldable portion 120 and enclose the optically active device 125. The internal guiding path 195 provides a path for the transmission of optical signals between the end part 200 of the optical transmission line and an optically active surface of the OAD 125.

In FIG. 4, the two openings are diametrically opposed to each other and the internal guiding path 195 extends along the longitudinal axis of the holding fixture 170 in a direction substantially perpendicular to the mounting surface of the reed 120. The first opening 185 is adapted to receive an external connector or plug (not shown) containing an optical fiber ferrule, thereby providing the interface to the external harness. The second opening 190 faces toward the reed 120 and has internal dimensions suitable for enclosing the OAD 125 when the holding fixture 170 is coupled or snapped to the reed 120.

Once coupled or snapped, the second opening 190 contacts uniformly the mounting surface 130 of the reed 120, thereby preventing external light coming from the lateral side from interfering with the optical signals transmitted in the internal guiding path 195. In the case where the OAD 125 is already shielded against electromagnetic radiation, the holding fixture 170 does not need to include a metallization layer for providing effective electromagnetic shielding to the OAD 125.

The holding fixture 170 may also accommodate an optical focusing device 197 to focus the light supplied to or from the optical transmission line. The optical focusing device may be external or internal to the optical transmission line alignment receptacle. In one example, the optical focusing device 197 may be a lens, in the internal guiding path 195 and disposed between, the first opening 185 and the second opening 190 for focusing the transmitted optical signal onto the optically active region of the optically active device 125 and/or on the end part 200 of the optical transmission line. The focusing of the optical signals transmitted through the internal guiding path 195 may be deployed when the distance between the optically active region of the OAD 125 and the end of the optical fiber ferrule is comparatively large on account of the length of the holding fixture 170. The longitudinal length of the holding fixture 170 may depend, among other factors, on the distance between the bending edge 135 and the attaching border 180 of the substrate 110, that is, on the location of the OAD 125 on the substrate 110.

In FIG. 4, the focusing element 197 may include a convex lens arranged at a central part of the internal guiding path 195 and transverse to the direction of optical transmission TT'. However, the holding fixture 170 may be provided without the optical focusing device 197 in case the optical transmission line is an optical fiber ferrule already including a lens at its coupling end.

In addition, or alternatively, the holding fixture 170 may include a light waveguide for bridging a part or the totality of the gap between the optically active surface of the OAD 125 and the end part 200 of the optical transmission line (not shown).

The holding fixture 170 may be easily modified to integrate one or a plurality of light paths for allowing the reception of one or a plurality of optical transmission lines so as to allow the optical coupling between one or a plurality of optically active regions of the OAD 125 and an external optical fiber cable, comprising one or a plurality of optical transmission lines.

In FIG. 4, the OAD 125 may be a transceiver module integrating the functions of a FOX and FOT, therefore, having two optically active regions 142, 144, respectively. In this case, the holding fixture 170 may be adapted to receive two optical transmission lines. An incoming optical transmission line for transmitting an incoming optical signal to the receiving optically active surface 142 of the FOX and an outgoing optical transmission line for transmitting an outgoing optical signal emitted by the emitting active region 144 of the FOT.

In addition, the holding fixture 170 may include two integrated light paths with included light guides (lens, optical fiber, etc.). Both paths may be in a fixed location and provide a contact element to the external harness. The oppositional contact elements may be available on the transceiver module and in optical alignment with the integrated light paths.

In the case where the OAD 125 may be a FOX or a FOT, therefore, having a single optically active surface, the holding fixture 170 may include a single light path and the optical elements required for coupling the OAD 125 with a single optical transmission line.

The holding fixture 170 may be easily modified to integrate one or a plurality of light paths for allowing the reception of one or a plurality of optical transmission lines so as to perform the optical coupling with one or a plurality of optically active regions of the OAD 125.

The second opening 190 may be specially designed to receive ferrules from a manufacturer and/or of a type, such as ferrules produced by laser welding, gluing and crimping.

In case the OAD 125 is adapted for being directly interfaced to an optical fiber ferrule without the need of any additional coupling parts, the holding fixture 170 is provided without any optical focusing devices or light guides. In this case, the second opening 190 and the internal guiding path 195 form an internal hollow that serves the only purpose of guiding the optical fiber ferrule to the receiving cavity of the OAD and of eventually maintaining the direction of the optical fiber with respect to the main board 115.

As illustrated in FIG. 4, the bending slot 135 may be milled on the same side S of the foldable portion 120 that approaches the main portion 115 upon folding. This may reduce the effect of compression that is increased in the substrate layers that are closer to the inner side of the bending edge 135 when the substrate board 110 undergoes bending and to prevent the bending region from breaking during or after the bending procedure. However, it may be envisaged to form the bending slot 135 on the outer side of the foldable portion 120, for instance, when conductive traces running through the bend region may be placed in a layer close to the inside of the bending slot 135 for reducing tension effects on the conductive traces.

As an example, the bending region may include a first outer layer, a second outer layer, and an inner later. Traces may be run between the first outer layer and the inner layer and the second outer layer and the inner layer to form a strip line for carrying electrical signals. Depending upon the thickness of the traces and flexibility or brittleness of the layers in the bending region between the main portion 115 and flexible portion 120, the bending region may include a third layer of traces. In addition to conductive traces that conduct electric signals, traces may pass through the bending slot 135 used for heat sinking the optical operative device 125. In addition, the flexible portion 120 may further include thermal wells for heat sinking the OAD 125.

The above examples may describe a substrate 110 that is substantially rigid and from which a selected portion is made foldable with respect to the main, portion by forming a region of increased flexibility in the substrate, thereby arriving at a pseudo-flex substrate having flexible parts. This pseudo-flex technique allows to a reduction in the number of assembly parts and simplification of the assembly of the optoelectrical interconnection system 100.

However, the optoelectrical interconnection system may also be realized using a rigid-flexible circuit board, and in which the main board 115 and the foldable board are provided as two separate rigid boards that are mechanically bond together by one or more flexible insulating layers that allow the plane of the foldable board to be inclined with respect to the main board by any angle. For example, the foldable portion 120 of the optoelectrical interconnection system may be realized by attaching a separate rigid board of an area suitable for arranging the OAD 125 to an edge of the main board 115 or to an opening of the main board 115 of a matching size by a stripe of flexible insulating material.

Conventional flexible materials used in flexible circuit boards include the flexible plastic films KAPTON, NOMEX, and TEFLON. These materials are employed for providing flexible regions of printed circuit boards, joining rigid regions of the circuit together and/or providing flexible connections to external assemblies. Both rigid and flexible substrates may be provided on one or both sides with a copper laminate circuit. An electrical connection between the separate rigid boards may be provided by conductive traces in the connecting flexible regions by wire bonding, or by any other form of electrical coupling.

Further, the optoelectrical interconnection system 100 may be provided with a substrate having a plurality of foldable portions, each foldable portion arranging one or more OADs and being located at distinct parts of the substrate so as to provide a plurality of optical interconnections with a plurality of optical fiber cables. Further, each foldable portion may be designed differently depending on the OAD arranged therein and be folded by different bending angles depending on the desired optical coupling orientation.

Further, the side of the substrate towards which the foldable portion is bowed is not limited to that shown in FIG. 2. For instance, the foldable portion may be folded towards the side of the main portion that is not populated with electronic devices so as to provide an optical coupling to an optical transmission axis TT' located on the side opposed to the mounting surface of the substrate board. In addition, the foldable portion 120 may have the OAD 125 mounted on a side that is opposite to the side that approaches the main portion 115 upon bending. For instance, the foldable portion 120 may be folded down or bowed in a counterclockwise direction with respect to the main board 115.

The position of the bending edge 135 is also not limited to the illustrated examples of FIGS. 1-4. For example, the bending edge 135 may be provided either at the left or at the right of the opening over which the foldable portion 120 is attached. Instead of being parallel to one of the main portion 115 borders, the bending 135 may be formed with other orientations, for instance, it may be aligned along a diagonal and intersecting two borders of the main portion.

Furthermore, the parameters for the previously discussed bending edge 135 relate to typical parameters for a non-heated bending process. In case the bending process is assisted by a heating treatment in the bending region so as to increase the flexibility of the insulating material, the parameters of the bending edge 135 may be considerably different for the same bend angle. In particular, the desired thickness of the bending edge 135 may be substantially larger than for a non-heated bending process and thick enough so as to remain rigid at ambient temperatures. In this last case, once folded up, the optoelectrical interconnection system 100 may even dispense the use of additional holding means for holding the foldable portion in the desired optical coupling orientation. This may be particularly useful in the case that it is desired to couple the OAD to an optical transmission axis that is not parallel to the main board.

Although the above-described examples refer to the substrate being a printed circuit board, the optoelectronic interconnection system 100 may be included on a substrate that is an independent platform of a small area that provides only the mechanical support and electrical interface to the OAD 125. In this case, the main portion 115 may not be populated with other electronic devices, and may only include connecting pins for electrically interfacing the OAD mounted on the foldable portion with another circuit board.

Figure 5A:
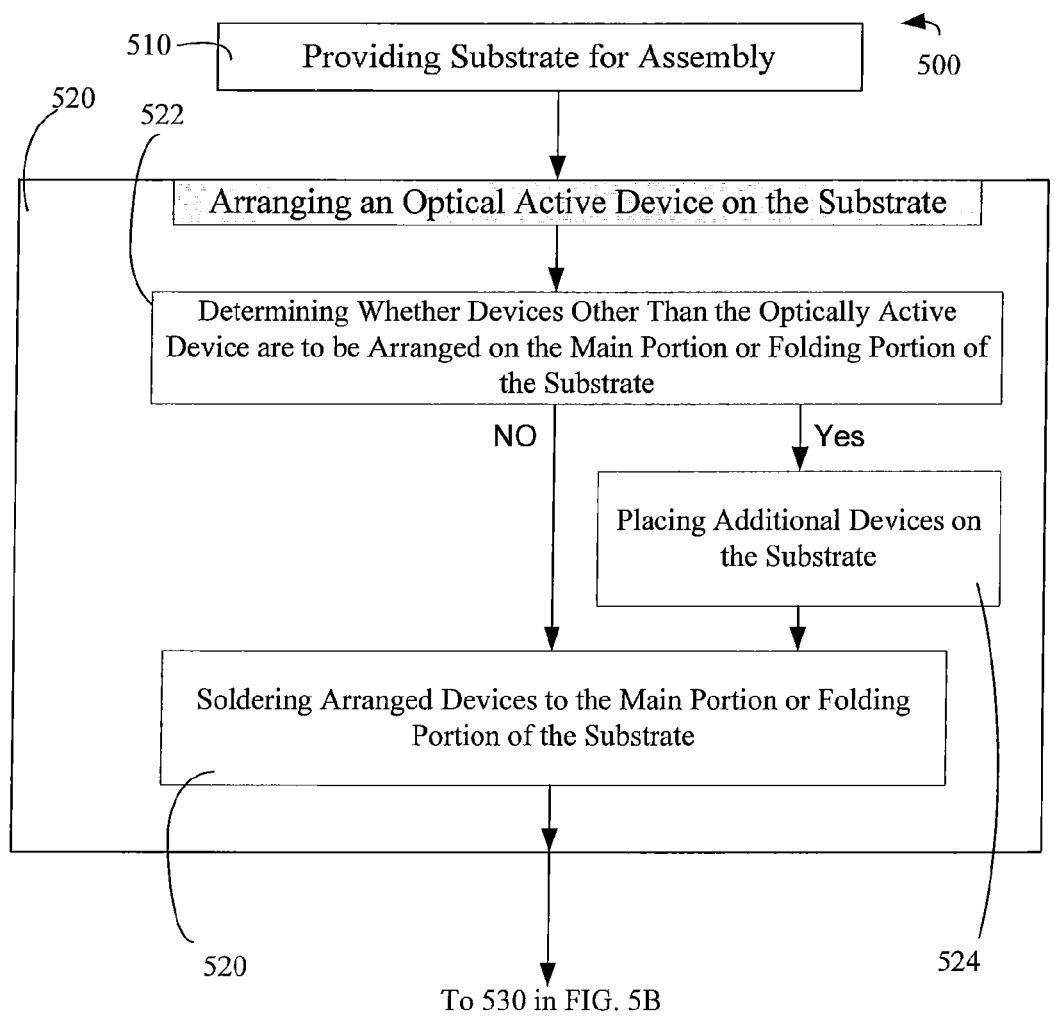
FIGS. 5A and 5B depict an operation to assemble the optoelectrical interconnection system.

In FIG. 5, an example operation 500 for producing an optoelectronic interconnection system 100 for use in optical communications is depicted and discussed relative to the optoelectronic interconnection system 100 depicted in FIGS. 2-4. In a state prior to bending, the bending slot 135 is formed as a groove 165 having a cavity. The depth and width of the groove cavity 165 is determined based on any of a number of parameters, as previously discussed.

The operation 500 includes a providing act 510. At the providing act 510, a substrate 110 including a main portion 115 and a foldable portion 120 is provided to form the foldable portion 120 on the substrate 110.

At arranging act 520, the optically active device 125 may be arranged on the foldable portion 120 of the substrate 110. Arranging the optically active device 125 may further include placing a surface mount optically active device 125 on the foldable portion 120.

As a further example of operation 500, the arranging act 520 may be further broken into additional discrete actions. For example, in addition to placing the surface mount optically active device 125 on the foldable portion. At determining act 522, the assembly machine may determine whether additional electrical or mechanical components are to be placed on the substrate 110 or the foldable portion 120.

At act 524, based upon a determination that additional parts are to be added to the substrate 110, additional electrical devices or mechanical devices may be mounted on the substrate.

At the affixing parts act 526, based upon determination that no additional components are to be added to the substrate 110 or the foldable portion 120, the surface mount optically active device 125 is soldered or attached or couple to the foldable portion 120 of the substrate 110. Otherwise, after all the components to be attached or coupled to the substrate are placed on the substrate 110, the surface mount optically active device 120 and the additional parts or components are soldered or attached or coupled to the substrate 110. Some of the addition electrical devices or mechanical devices may be later placed and soldered, coupled, or attached to the foldable portion 120. Thereafter, operation 500 proceeds to folding act 530.

Figure 5B:
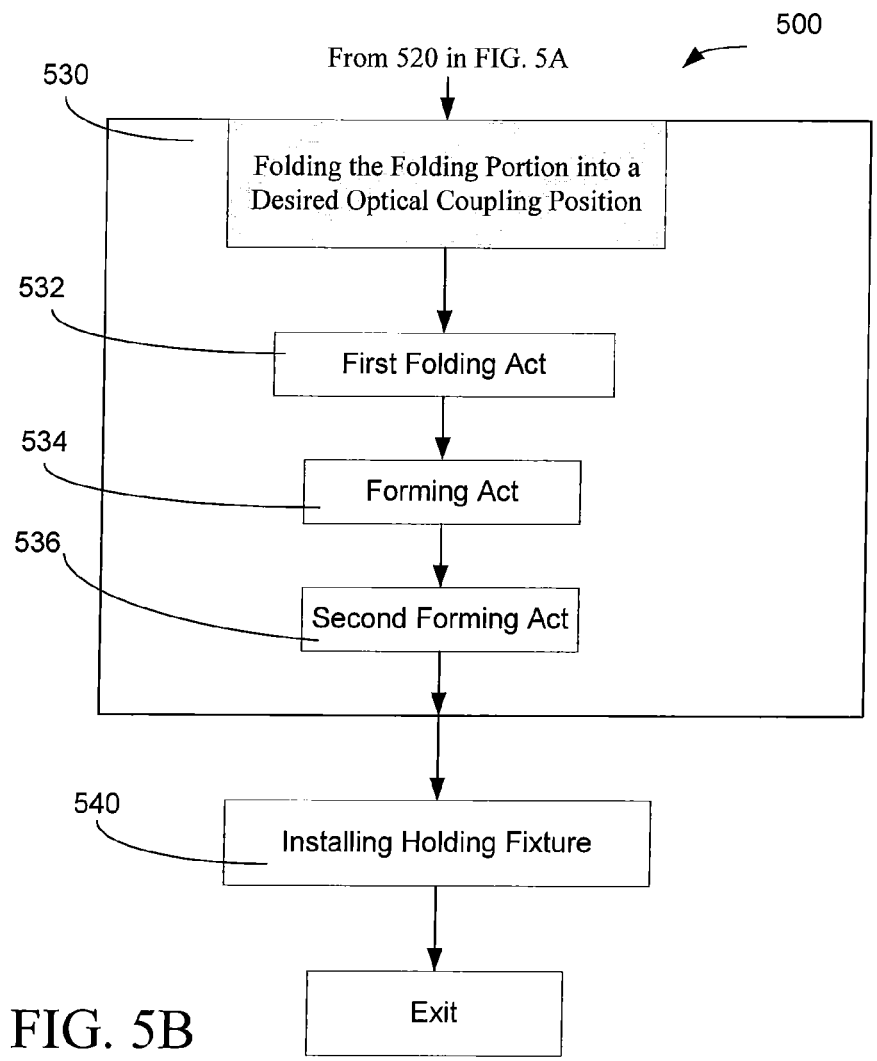

In FIG. 5B, at folding act 530, the foldable portion 120 of the substrate 110 may be folded to a desired optical coupling orientation. At the desired optical coupling orientation, the optical operative axis may be substantially aligned with an optical transmission axis that is not perpendicular to the main portion. As an example, foldable portion 120 may be bent to orient the optical transmission axis to be substantially parallel to the main board 115.

Alternatively, the foldable portion 120 may be bent to orient the optical transmission axis to be other than perpendicular to the main board 115.

The folding act 530 may further include a first forming act 532. At a first forming act 532, the foldable portion or reed 120 of the substrate 110 may be formed. The foldable portion 120 may be formed into the shape of a reed by creating a slot 145 across the thickness of the substrate and along edges of the reed 120 that are to be freed from the substrate 110.

The folding act 534 may further include cutting each slot 145 across the thickness of the substrate 110 to free the respective edge of the foldable portion or reed 120 from mechanical contact with the substrate 110. Thereafter, operation 500 proceeds to a second forming act 534.

At a second forming act 536, the bent edge 135 may be formed by creating a bending slot 135 with a specified depth across the thickness of the substrate 110 and along an edge of the reed 120 to be bent. At the installing holding fixture act 540, the holding fixture 170 is installed.

While various examples of the invention have been described, it will be apparent to those of ordinary skill in the art that many more embodiments and implementations are possible within the scope of the invention. Accordingly, the invention is not to be restricted except in light of the attached claims and their equivalents.

We claim:

1. An optoelectronic interconnection system for use in optical communications, comprising:
   an optically active device having an optical operative axis; and
   a substrate comprising a main portion, a foldable portion, and a bending edge formed from the substrate, the main portion, the foldable portion and the bending edge formed from one piece, the bending edge mechanically connects the foldable portion to the main portion, and the optically active device coupled to the foldable portion; and
   where the foldable portion is adapted to be folded at the bending edge with respect to the main portion into a predetermined orientation so that the optical operative axis of the optically active device is aligned substantially in parallel with an optical transmission axis, where the optical transmission axis is other than perpendicular to the main portion,
   where the foldable portion includes an end part that is connected to the main portion by the bending edge, the foldable portion being formed from out of the substrate by a slot formed in the substrate along edges of the foldable portion that are separated away from the substrate, and the bending edge being a bending slot formed at the end part of the foldable portion by partial removal of a thickness of the substrate to a determined bending thickness.

2. The optoelectronic interconnection system of claim 1, where the foldable portion includes a central surface that is substantially flat, the optically active device mounted on the central surface, and the bending edge adapted to allow the central surface of the foldable portion to be bowed with respect to the main portion by a determined bend angle.

3. The optoelectronic interconnection system of claim 1, where the optical transmission axis is substantially parallel to the main portion, and where the foldable portion includes a mounting surface, the optically active device in contact with the mounting surface such that the optical operative axis is substantially perpendicular to the mounting surface.

4. The optoelectronic interconnection system of claim 2, where the main portion is formed to include an opening, the foldable portion is connected over the opening by the bending edge, and the opening is dimensioned to allow the foldable portion to be folded with respect to the opening.

5. The optoelectronic interconnection system of claim 1, where the foldable portion is adapted to electrically interface with the optically active device; and
   where the substrate includes embedded conductive pathways adapted to electrically interface the foldable portion with the main portion.

6. The optoelectronic interconnection system of claim 1, where the substrate is a printed circuit board; and
   the printed circuit board includes a plurality of contacts for electrically interfacing with a host circuit board of a host system, a portion of the contacts being adapted to be electrically coupled to the optically active device.

7. The optoelectronic interconnection system of claim 1, further comprising:
   a holding fixture adapted to attach to the foldable portion and to hold the foldable portion in the predetermined orientation with respect to the main portion.

8. The optoelectronic interconnection system of claim 7, where the holding fixture includes a first fixation element and a second fixation element;
   where the main portion includes a first receiving element and a second receiving element; and where the first fixation element is adapted to attach to the first receiving element, and the second fixation element is adapted to attach to the second receiving element.

9. The optoelectronic interconnection system of claim 7, where the holding fixture is formed to include a first opening and a second opening, the second opening connected to the first opening by an internal guiding path formed in the holding fixture; and
   where the holding fixture is attached to the foldable portion;
   where the first opening is adapted to receive an end part of an optical transmission line, the end part of the optical transmission line being substantially aligned with the optical transmission axis; and
   where the second opening is positioned in the holding fixture to face the foldable portion and is adapted to receive the optically active device.

10. The optoelectronic interconnection system of claim 9, where the first opening is a ferrule receiving bore adapted to interconnect directly to the end part of the optical transmission line.

11. The optoelectronic interconnection system of claim 9, where the holding fixture further includes an optical focusing device disposed between the first opening and the second opening, the optical focusing device adapted to focus an optical signal transmitted in the internal guiding path onto one of an optically active region of the optically active device and the end part of the optical transmission line.

12. The optoelectronic interconnection system of claim 9, where the internal guiding path includes an optical guide adapted to transmit an optical signal between the optically active device and the end part of the optical transmission line.

13. The optoelectronic interconnection system of claim 7, where the optically active device is an optical transceiver system comprising an electro-optical converter component and an optoelectrical converter component; and
   where the holding fixture is adapted to receive an optical transmission line including an incoming transmission line for transmitting an incoming optical signal to the optoelectrical converter component and an outgoing transmission line for transmitting an outgoing optical signal emitted by the electro-optical converter component.

14. The optoelectronic interconnection system of claim 1, where the optically active device is a surface mount device electrically interfaced to the foldable portion, and the foldable portion includes surface mount pads to receive the optically active device.

15. The optoelectronic interconnection system of claim 7, where the main portion includes a plurality of electronic circuits, and
   the holding fixture is removably attached to the foldable portion and the main portion.

16. A method of producing an optoelectronic interconnection system for use in optical communications, comprising:
   providing a substrate comprising a main portion and a foldable portion formed from the substrate, the main portion and the foldable portion formed from a single piece, the foldable portion having a substantially flat central surface and an end part mechanically connected to the substrate by a bending edge;
   arranging an optically active device on the substantially flat central surface of the foldable portion; and
   folding the foldable portion to a predetermined orientation so that an optical operative axis of the optically active device is substantially aligned with an optical transmission axis that is other than perpendicular to the main portion,
   where providing the substrate includes:
   forming the foldable portion by forming a slot across the thickness of the substrate and along edges of the foldable portion that are to be freed from the substrate; and
   forming the bending edge by partially forming a bending slot with a specified depth across the thickness of the substrate and along an edge of the foldable portion to be bent.

17. A method of producing an optoelectronic interconnection system for use in optical communications, comprising:
   providing a substrate comprising a main portion and a foldable portion formed from the substrate, the foldable portion having a substantially flat central surface and an end part mechanically connected to the substrate by a bending edge;
   arranging an optically active device on the substantially flat central surface of the foldable portion; and
   folding the foldable portion to a predetermined orientation so that an optical operative axis of the optically active device is substantially aligned with an optical transmission axis that is other than perpendicular to the main portion,
   where providing the substrate includes:
   forming the foldable portion by milling a slot across the thickness of the substrate and along edges of the foldable portion that are to be freed from the substrate;
   forming the bending edge by partially milling a bending slot with a specified depth across the thickness of the substrate and along an edge of the foldable portion to be bent; and
   coupling a holding fixture with at least one of the edges of the foldable portion and an attaching border of the main portion that is oppositely disposed from the bending edge to hold the foldable portion in the predetermined orientation.

18. An optical apparatus comprising:
   a substrate that is substantially rigid and includes a main portion in a first plane and a foldable portion, where the foldable portion is formed from out of the substrate by forming a slot across the thickness of the substrate and along edges of the foldable portion that are to be freed from the substrate;
   the substrate further formed to include a bending slot with a specified depth across the thickness of the substrate and along an edge of the foldable portion to be bent, where the bending slot forms a bending edge that connects the foldable portion to the substrate;
   an optical device mounted to the foldable portion, the optical device having an operable optical coupling orientation, where the optical device is electrically coupled through the bending edge to the main portion of the substrate; and
   where the foldable portion is oriented to lie in a second plane, and where the operable optical coupling orientation of the optical device is perpendicular to the second plane, and the first plane and the second plane are divergent.

19. The optical apparatus of claim 18, further comprising:
   a first electrical component attached to a first side of the substrate; and
   a second electrical component attached to a second side of the substrate.

20. The optical apparatus of claim 18, further comprising:
a holder coupled to the substrate and the foldable portion of the substrate;
where the holder is configured to hold the foldable portion in a position to align the operable optical coupling orientation of the optical device in a desired relationship to the first plane.

21. The optical apparatus of claim 18, wherein the optical device is a photodiode receiver.

22. The optical apparatus of claim 18, where the bending edge further includes an electrical trace between the foldable portion of the substrate and the main portion of the substrate; and
where the optical device is in communication with an electric circuit on the main portion through the electrical trace.

23. The optical apparatus of claim 22, wherein the substrate includes a material including an electrical characteristic; and
where a depth of the bending slot is based upon a desired electrical characteristic of the electrical trace between the foldable portion and the main portion.

24. The optoelectronic interconnection system of claim 23, where the optically active device is electrically coupled through the bending edge to the main portion of the substrate.

* * * * *